United States Patent [19]

Katagiri

[11] Patent Number: 5,047,716
[45] Date of Patent: Sep. 10, 1991

[54] MOVEMENT DETECTOR EMPLOYING CONSTANT CURRENT DRIVE

[75] Inventor: Takashi Katagiri, Nagano, Japan

[73] Assignee: K.K. Sankyo Seiki Seisakusho, Nagano, Japan

[21] Appl. No.: 312,157

[22] Filed: Feb. 21, 1989

[30] Foreign Application Priority Data

Feb. 19, 1988 [JP] Japan .................................. 63-21060
Feb. 19, 1988 [JP] Japan .................................. 63-36912

[51] Int. Cl.$^5$ .............................................. G01B 7/14
[52] U.S. Cl. ............................................ 324/207.21
[58] Field of Search ............... 324/207, 208, 251, 252, 324/235, 262; 338/32 R, 32 H; 341/15; 360/113

[56] References Cited

U.S. PATENT DOCUMENTS

| | | | |
|---|---|---|---|
| 4,403,187 | 9/1983 | Takahashi et al. | 324/208 |
| 4,418,372 | 11/1983 | Hayashida et al. | 324/252 X |
| 4,429,276 | 1/1984 | Harimatsu et al. | 324/252 X |
| 4,594,548 | 6/1986 | Takahashi et al. | 324/208 |
| 4,628,259 | 12/1986 | Takahashi et al. | 324/208 |
| 4,639,807 | 1/1987 | Sekizawa et al. | 324/208 X |
| 4,731,580 | 3/1988 | Indo | 324/208 |
| 4,766,376 | 8/1988 | Takahashi et al. | 324/208 |

FOREIGN PATENT DOCUMENTS 54-10775 1/1979 Japan .

Primary Examiner—Kenneth Wieder
Assistant Examiner—Warren S. Edmonds
Attorney, Agent, or Firm—Sughrue, Mion, Zinn, Macpeak & Seas

[57] ABSTRACT

A magnetic movement detector employing a constant current drive system wherein the consumed power is reduced and temperature increases suppressed, thereby preventing a decrease in the output voltage. A magnetic recording medium is magnetized with a repetitive signal having a wavelength $\lambda$. A magnetic resistance element disposed adjacent the recording medium is composed of 2m serially connected magnetic resistance strips which are arranged at intervals of $(n-\frac{1}{2})\lambda$, where m and n are natural numbers. A DC source is connected to interconnected ends of two adjacent ones of the strips, while constant current source are connected to ends of respective other ones of the strips. An output signal is produced as the difference between the voltages at the ends of the latter two strips.

11 Claims, 7 Drawing Sheets

MOVEMENT DETECTOR EMPLOYING CONSTANT CURRENT DRIVE

BACKGROUND OF THE INVENTION

This invention relates to a magnetic detector which may be employed as a magnetic rotary encoder or linear scale.

A conventional magnetic detector, as shown in FIG. 11, comprises: a magnetic drum 1; and a magnetic resistance element 2; and a signal processing circuit 3. The magnetic drum 1 is a magnetic recording medium which is magnetized in such a manner that N and S poles occur alternately at certain intervals; that is, it is magnetized with a repetitive signal having a certain wavelength $\lambda$. The magnetic resistance element 2, as shown in FIG. 12, is made up of a plurality of magnetic resistance strips 4, 5, 6 and 7 (hereinafter referred to as "MR strips", when applicable). The MR strips 4, 5, 6 and 7 face the magnetic drum, and are arranged at intervals of $\lambda/4$, $\lambda/8$ and $\lambda/4$ in the direction of rotation of the magnetic drum 1. In the case of a current drive system in which the MR strips 4 through 7 are driven with current, the signal processing circuit 3 comprises: constant current sources 8, 9, 10 and 11; and differential amplifiers 12 and 13.

First ends of the MR strips 4 through 7 are connected to a DC source having a voltage Vc, and the other ends are connected to the constant current sources 8 through 11, respectively. In response to magnetic signals from the magnetic drum 1, the resistances $R_{11}(x)$, $R_{12}(x)$, $R_{13}(x)$ and $R_{14}(x)$ of the MR strips 4 through 7 change with the relative movement distance of the magnetic drum 1 and the magnetic resistance element 2. The differential amplifier 12 performs the differential amplification of the voltages $V_{11}(x)$ and $V_{12}(x)$ of the constant current sources 8 and 9, and the differential amplifier 13 performs the differential amplification of the voltages $V_{13}(x)$ and $V_{14}(x)$ of the constant current source 10 and 11. As the magnetic drum 1 and the magnetic resistance element 2 are moved relative to each other in the direction of the arrow, the resistances $R_{11}(x)$ and $R_{12}(x)$ of the MR strips 4 and 5 and the resistances $R_{13}(x)$ and $R_{14}(x)$ of the MR strips 6 and 7 change in opposite phase to each other, and the resistances $R_{11}(x)$ and $R_{13}(x)$ of the MR strips 4 and 6 change with a 90° phase difference, as a result of which the differential amplifiers 12 and 13 output sine waves $e_{11}(x)$ and $e_{12}(x)$ which are different by 90° in phase from each other.

In the above-described magnetic detector, the magnetic resistance element 2 is formed with the MR strips 4 through 7 as unitary segments. Therefore, when an external disturbance magnetic field is applied to the magnetic detector, then the output signals of the differential amplifiers 12 and 13 will include noise components. This will be described in more detail. Examples of the external disturbance magnetic field are magnetic noises directly induced by an electric motor, or caused by the electro-magnetic braking of an electric motor. The noises are low frequency noises whose periods are 100 to 1000 times as high as that of the output magnetic signal of the magnetic recording medium. Therefore, when such an external disturbance magnetic field is applied to the magnetic detector, a bias magnetic field corresponding to the external disturbance magnetic flux density Bo of the external disturbance magnetic field, as shown in part (b) of FIG. 13, is applied to the MR strips.

When the output currents of the constant current sources 8 through 11 are represented by I, then the following equations (1) through (4) are established:

$$V_{11}(x) = V_c - R_{11}(x)I \quad (1)$$

$$V_{12}(x) = V_c - R_{12}(x)I \quad (2)$$

$$e_{11}(x) = V_{11}(x) - V_{12}(x) \quad (3)$$

$$R_{12}(x) = R_{11}(x+\lambda 4) \quad (4)$$

where the amplification factors of the differential amplifiers 12 and 13 are set to one (1).

The following magnetic flux density $B_{11}(x)$ is applied to the MR strip 4:

$$B_{11}(x) = Bo + Ba \sin(2\pi/\lambda)x \quad (5)$$

where Bo is the external disturbance magnetic flux density, and Ba is the amplitude of the signal magnetic flux density produced by the magnetic record signal of the magnetic drum.

The resistance change rate of the MR strip 4 with respect to the applied magnetic flux density, approximating a quadratic curve as shown in part (a) of FIG. 13, is assumed to be as follows:

$$\rho(B_{11}(x)) = A\{B_{11}(x)\}^2 \quad (6)$$

where $\rho$ is the rate of decrease.

When the magnetic flux density $B_{11}(x)$ is applied to the MR strip 4 as shown in part (b) of FIG. 13, the resistance change rate $\rho(B_{11}(x))$ of the MR strip 4 changes as shown in part (c) of FIG. 13. The relation of the resistance $R_{11}(x)$ of the MR strip 4 and the applied magnetic flux density is as follows:

$$R_{11}(x) = Ro\{1 - \rho(B_{11}(x))\} \quad (7)$$

where Ro is the resistance of the MR strip 4 when the magnetic flux density applied thereto is 0 (gauss). As is apparent from equation (7), when the magnetic flux density $B_{11}(x)$ is applied to the MR strip 4, the resistance $R_{11}(x)$ of the strip 4 is decreased from $R_0$ as much as $R_O R\rho(B_{11}(x))$.

When equations (5) and (6) are inserted into equation (7), then $$R_{11}(x) = Ro\{1 - A(Bo^2 + Ba^2/2 + 2BoBa \cdot \sin(2\pi/\lambda)x - (Ba^2/2) \cdot \cos(4\pi/\lambda)x)\} \quad (8)$$

From equations (8) and (4), $$R_{12}(x) = Ro\{1 - A(Bo^2 + Ba^2/2 + 2BoBa \cdot \cos(2\pi/\lambda)x + (Ba^2/2) \cdot \cos(2\pi/\lambda)x)\} \quad (9)$$

When equations (1), (2), (8) and (9) are inserted in equation (3), the output signal $e_{11}(x)$ of the differential amplifier 12 is as follows:

$$e_{11}(x) = \cdot R_0 I A B a^2 - \cos(-4\pi/\lambda)x + 2\sqrt{2} \cdot \quad (10)$$
$$R_0 I A B_0 B a \sin(2\pi x/\lambda - \pi/4)$$

In equation (10), the first term of the right side indicates the signal component which repeats every $x = \lambda/2$, and the second term of the right side indicates the noise component whose frequency is a half ($\frac{1}{2}$) of the frequency of the signal which repeats every $x = \lambda$. Therefore, the amplitude of the noise component is $2\sqrt{2}R_0IAB_0Ba$, and the noise component is zero (0) when the external disturbance magnetic flux density $B_0$ is zero (0). Equation (10) means that, with $B_0 \neq 0$, the noise component whose frequency is a half of that of the signal which repeats every $x = \lambda$ is superposed on the signal component. The ratio of amplitude of the signal $e_{11}(x)$ and the noise component is:

$$2\sqrt{2}\ R_0 IAB_0 Ba / R_0 IAB_0 Ba^2 = 2\sqrt{2}\ B_0/Ba \quad (11)$$

As is apparent from equation (11), the magnetic flux density ratio $B_0/Ba$ is converted into a voltage signal, and the S/N ratio is amplified by a factor of $2\sqrt{2}$.

As is apparent from the above description, the conventional magnetic detector is disadvantageous in that, when an external disturbance magnetic field is applied thereto, the output signals of the differential amplifiers 12 and 13 will include the noise components, and therefore in processing them into square waves, the duty ratio changes every period.

SUMMARY OF THE INVENTION

Accordingly, an object of this invention is to eliminate the above-described difficulty accompanying a conventional magnetic detector.

The foregoing object and other objects of the invention have been achieved by the provision of a magnetic detector which, according to the invention, comprises: a magnetic recording medium magnetized with a repetitive signal having a predetermined wavelength $\lambda$; a magnetic resistance element comprising 2 m magnetic resistance strips which are arranged at intervals of $(n-\frac{1}{2})\lambda$ and series-connected as unitary segments (where m and n are natural numbers); and DC source and constant current source for supply drive currents to the 2 m magnetic resistance strips, the magnetic resistance element being held confronted with the magnetic recording medium, output signals being provided between the magnetic resistance strips and the constant current sources.

The nature, principle and utility of the invention will become more apparent from the following detailed description when read in conjunction with the accompanying drawings.

DETAILED DESCRIPTION OF THE INVENTION

Figure 1A:
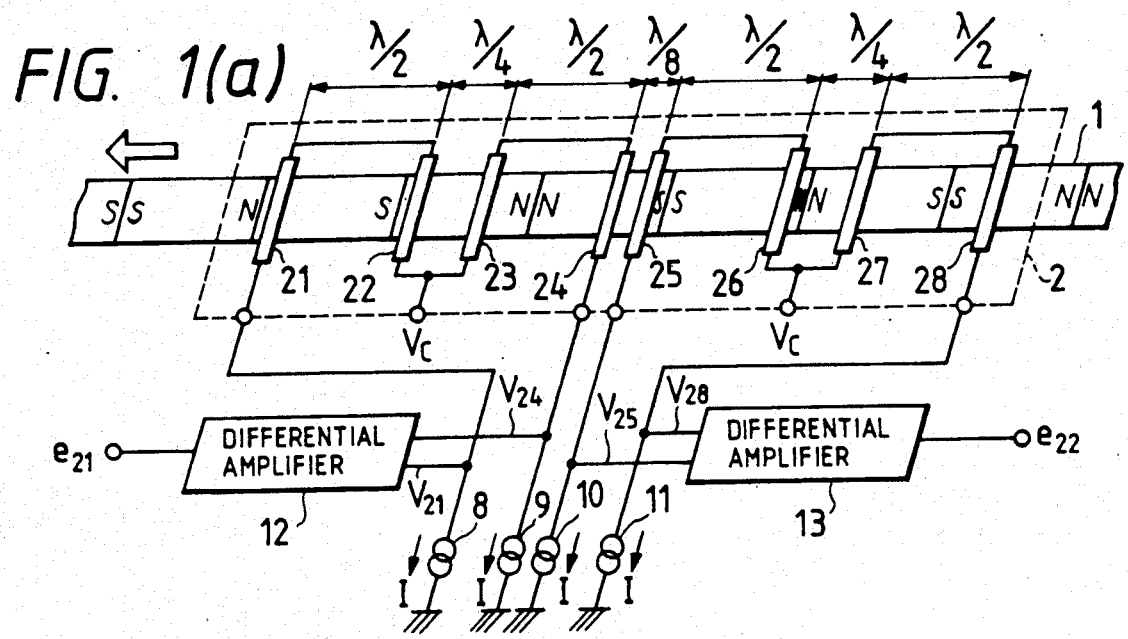
FIGS. 1(a)-1(e) through 9 are diagrams showing examples of a magnetic detector according to this invention; especially FIG. 6 showing one example of the magnetic detector which employs a voltage drive system.

One example of a magnetic detector according to this invention is as shown in part (a) of FIG. 1.

The magnetic detector may be formed by modifying the above-described conventional magnetic detector in such a manner that the magnetic resistance element 2 is made up of MR strips 21 through 28. Pairs of MR strips 21 and 22, 23 and 24, 25 and 26, and 27 and 28 are connected, as unitary segments, in series to each other, respectively. First ends of the series circuits of MR strips 21 and 22, 23 and 24, 25 and 26, and 27 and 28 are connected to a DC source having an output voltage Vc, and the other ends are connected to constant current sources 8, 9, 10 and 11, respectively. The MR strips 21 through 28 face a magnetic drum 1, and are arranged at intervals of $\lambda/2$, $\lambda/4$, $\lambda/2$, $\lambda/8$, $\lambda/2$, $\lambda/4$ and $\lambda/2$, as shown in part (a) of FIG. 1.

In each of the pairs of MR strips 21 and 22, 23 and 24, 25 and 26, and 27 and 28, the MR strips are spaced $\lambda/2$ from each other. Therefore, the resistances $R_{21}(x)$ and $R_{22}(x)$, $R_{23}(x)$ and $R_{24}(x)$, $R_{25}(x)$ and $R_{26}(x)$, and $R_{27}(x)$ and $R_{28}(x)$ thereof change in phase with one another. The pairs of MR strips 21 and 22, and 23 and 24 are spaced by $\lambda/2 + \lambda/4$ from each other, and similarly the pairs of MR strips 25 and 26, and 27 and 28 are spaced by $\lambda/2 + \lambda/4$ from each other.

Therefore, the resistances $R_{21}(x)$ and $R_{22}(x)$, and $R_{23}(x)$ and $R_{24}(x)$ change in opposite phase to each other, and the resistances $R_{25}(x)$ and $R_{26}(x)$, and $R_{27}(x)$ and $R_{28}(x)$ change also in opposite phase to each other. Accordingly, the voltages $V_{21}(x)$ and $V_{24}(x)$, and $V_{25}(x)$ and $V_{28}(x)$ of the constant current sources 8 and 9, and 10 and 11 are differential outputs. The interval between the MR strips 21 and 22, and 25 and 26 is $\lambda 2 + \lambda 4 + \lambda 2 + \lambda 8 = 13\lambda/8$. Therefore, the resistances changes with a phase difference of 90°, and the voltage $V_{21}(x)$ and $V_{25}(x)$ of the constant current sources 8 and 10 change with a phase difference of 90°.

The part (b) of FIG. 1 is a characteristic diagram of the magnetic detector shown in part (a) of FIG. 1. The resistance change rates $\pi(B_{21}(x))$ and $\rho(b_{22}(x))$ of the MR strips 21 and 22 with respect to the applied magnetic flux densities can be approximated to a quadratic curve as shown in part (b) of FIG. 1. The MR strips 21 and 22 are spaced $\frac{\lambda}{2}$ from each other. Therefore, as the magnetic flux densities $B_{21}(x)$ and $B_{22}(x)$ applied to the MR strips 21 and 22 change as shown in part (c) of FIG. 1, the resistance change rates $\rho(B_{21}(x))$ and $\rho(B_{22}(x))$ of the MR strips 21 and 22 change as shown in part (d) of FIG. 1. Since the MR strips 21 and 22 form a series circuit, the rate of change $(\rho(B_{21}(x)) + \rho(B_{22}(x)))$ of the composite resistance of the MR strips 21 and 22 changes as shown in part (e) of FIG. 1. This is the sum of the resistance change rates of the MR strips 21 and 22 shown in part (d) of FIG. 1.

Thus, the output signals $e_{21}(x)$ and $e_{22}(x)$ of the differential amplifiers 12 and 13 are approximate sine wave signals which are different by 90° in phase from each other.

In the above-described magnetic detector, the following equations can be held:

$$V_{21}(x) = Vc - \{R_{21}(x) + R_{22}(x)\}I \quad (12)$$

$$V_{24}(x) = Vc - \{R_{23}(x) + R_{24}(x)\}I \quad (13)$$

$$e_{21}(x) = V_{21}(x) - V_{24}(x) \quad (14)$$

$$R_{21}(x) = R_{11}(x) \quad (15)$$

$$R_{22}(x) = R_{11}(x + \lambda/2) \quad (16)$$

$$R_{23}(x) = R_{11}(x + 3\lambda/4) \quad (17)$$

$$R_{24}(x) = R_{11}(x + 5\lambda/4) = R_{11}(x + \lambda/4) \quad (18)$$

Insertion of equation (8) in equations (15) through (18) results in the following equations (19) through (22):

$$R_{21}(x) = Ro\{1 - A(Bo^2 + Ba^2/2 + 2BoBa\sin(2\pi/\lambda)x - (Ba^2/2)\cos(4\pi/\lambda)x)\} \quad (19)$$

$$R_{22}(x) = Ro\{1 - A(Bo^2 + Ba^2/2 - 2BoB\sin(2\pi/\lambda)x - (Ba^2/2)\cos(4\pi/\lambda)x)\} \quad (20)$$

$$R_{23}(x) = Ro\{1 - A(Bo^2 + Ba^2/2 + 2BoBa\cos(2\pi/\lambda)x + (Ba^2/2)\cos(4\pi/\lambda)x)\} \quad (21)$$

$$R_{24}(x) = Ro\{1 - A(Bo^2 + Ba^2/2 + 2BoBa\cos(2\pi/\lambda)x + (Ba^2/2)\cos(4\pi/\lambda)x)\} \quad (22)$$

Since the MR stripes 21 and 22 are connected in series to each other, the composite resistance thereof is as follows:

$$R_{21}(x) + R_{22}(x) = 2Ro\{1 - A(Bo^2 + Ba^2/2 - (Ba^2/2)\cos(4\pi/\lambda)x)\} \quad (23)$$

It can be understood from equation (23) that the noise component $\sin(2\pi/\lambda)x$ whose frequency is half of that of the signal is cancelled out.

Similarly, the composite resistance of the MR strips 23 and 24 is as follows:

$$R_{23}(x) + R_{24}(x) + 2Ro\{1 - A(Bo^2 + (Ba^2/2) + (Ba^2/2)\cos(4\pi/\lambda)x)\} \quad (24)$$

The noise component whose frequency is a half of that of the signal is also cancelled out.

When equations (12), (13), (23) and (24) are inserted in equation (14), then the output signal $e_{21}(x)$ of the differential amplifier 12 is:

$$e_{21}(x) = -2RoI\,A\,Ba^2\cos(4\pi/\lambda)x \quad (25)$$

Thus, only the signal component which repeats every $x = \lambda/2$ appears. As is apparent from the above description, with the magnetic detector, the noise component is zero, and it is essentially cancelled out.

As is clear from equation (23) or (24), when the MR strips are arranged at intervals of $\lambda/2$ (or $3\lambda/2$, $5\lambda/2$, ...) and series-connected as unitary segments, then the external disturbance magnetic flux density is cancelled, and the noise component is zeroed.

A second example of the magnetic detector according to the invention will be described with reference to FIG. 2.

Figure 1B:
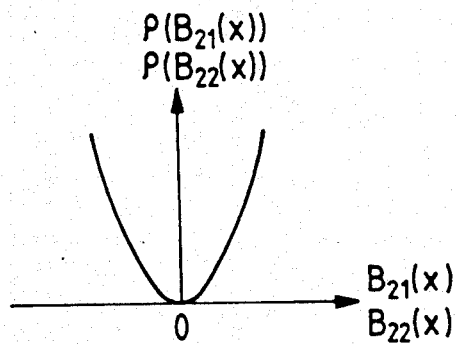
Figure 1D:
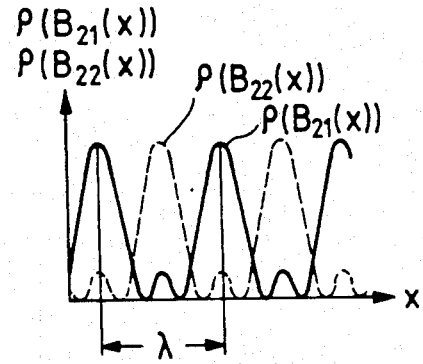
Figure 1C:
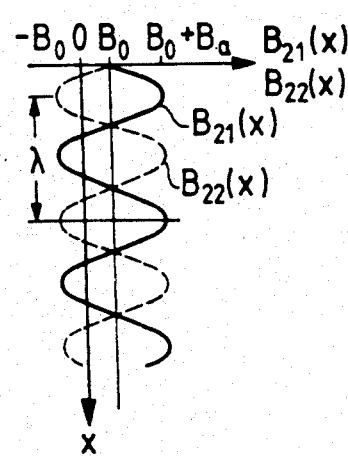
Figure 1E:
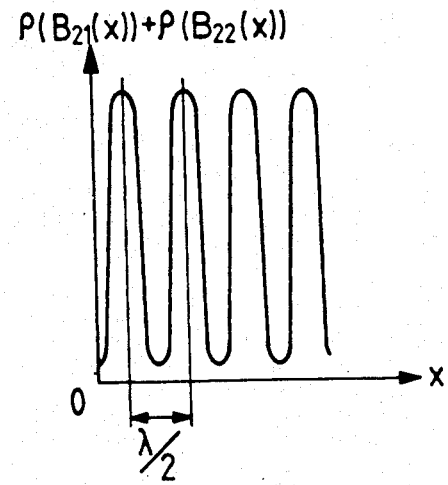
Figure 2:
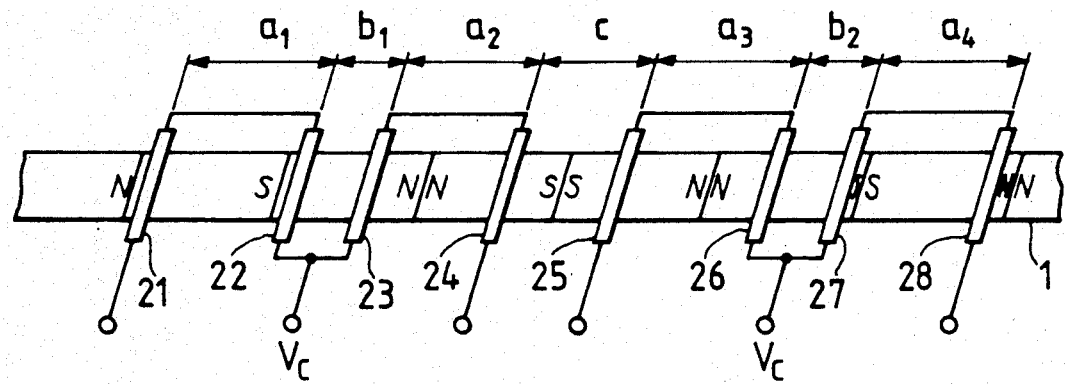

The magnetic detector of FIG. 2 can be obtained by modifying the magnetic detector of the part (a) of FIG. 1 in such a manner that the MR strips 21 through 28 face the magnetic drum 1, and are arranged at intervals of $a_1$, $b_1$, $a_2$, $c$, $a_3$, $b_2$ and $a_4$. These data are so selected as to satisfy the following conditions:

$$a_1, a_2, a_3, a_4 = (n - \tfrac{1}{2})\lambda$$

$$b_1, b_2 = m\lambda/4$$

$$c = L\lambda/8$$

where n is the natural number, and m and L are the positive odd numbers.

When, as was described above, $a_1$, $a_2$, $a_3$ and $a_4$ are set to $(n-\tfrac{1}{2})\lambda$; i.e., $3\lambda/2$, $5\lambda/2$, and so on, then as in the above-described embodiment of FIG. 1(a), the noise component is zeroed. The resistance change rates of the MR strips with respect to the applied magnetic flux densities can be approximated to a quadratic curve as shown in FIG. 1(b), and therefore when $b_1$ and $b_2$ are set to $m\lambda/4$; i.e., $\lambda/4$, $3\lambda/4$, $5\lambda/4$ and so forth, the same effects can be obtained. In addition, when c is set to $L\lambda/8$; i.e., $\lambda/8$, $3\lambda/8$, $5\lambda/8$ and so on, the same effects can be obtained.

A third example of the magnetic detector according to the invention will be described with reference to FIG. 3.

Figure 3:
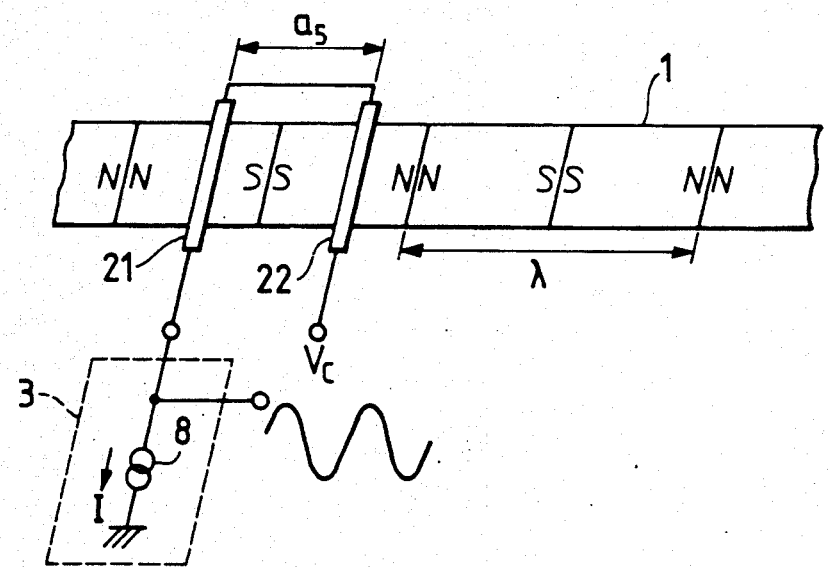
Figure 4:
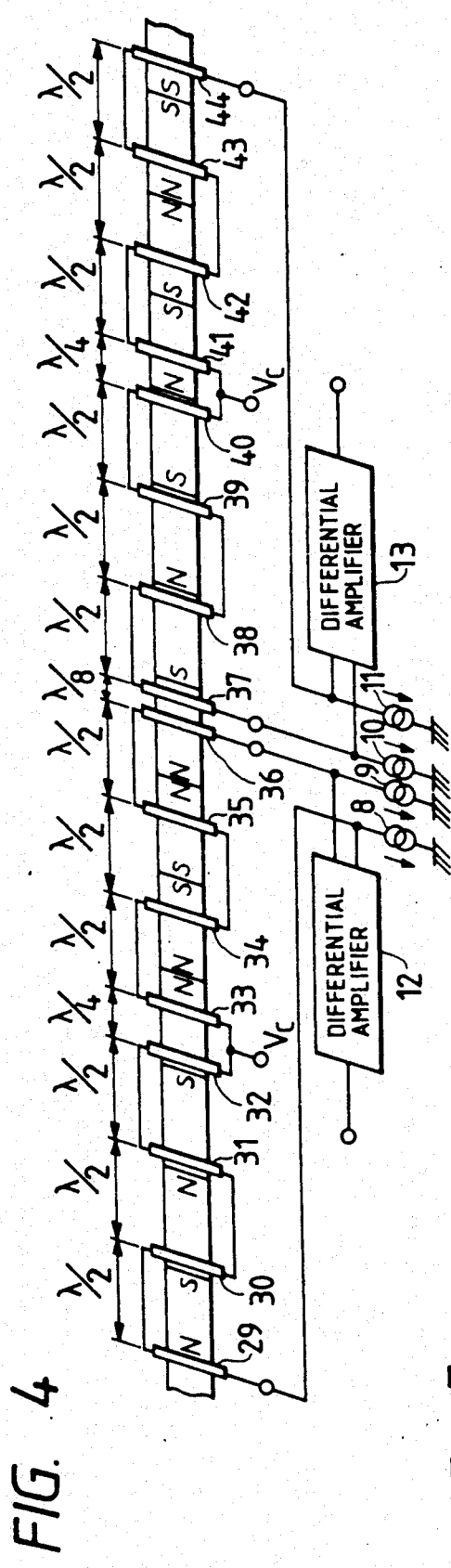

The magnetic detector of FIG. 3 can be obtained by modifying the magnetic detector of FIG. 2 in such a manner that the magnetic resistance element 2 is made up of MR strips 21 and 22, and the signal processing circuit 3 comprises a constant current source 8. The distance $a_5$ between the MR strips 21 is so determined as to satisfy the following condition:

$$a_5 = (n - \tfrac{1}{2})\lambda$$

where n is a natural number. Similarly as in the above-described embodiments, with the magnetic detector of FIG. 3 the noise component is zeroed. FIG. 4 shows a fourth example of the magnetic detector according to the invention.

In the first and second examples of the magnetic detector, as shown in FIGS. 1(a)-1(e) and 2, the unitary segments are made up of pairs of MR strips 21 and 22, 23 and 24, 25 and 26, and 27 and 28, respectively. On the other hand, in the fourth example, the unitary segments are made up of groups of four MR strips 29 through 32, four MR strips 33 through 36, four MR strips 37 through 40, and four MR strips 41 through 44, respectively, and these unitary segments are connected between a DC source and constant current sources 8 through 11, as shown in FIG. 4. The MR strips 29 through 44 face the magnetic drum 1, and are arranged at intervals of $\lambda/2$, $\lambda/2$, $\lambda/2$, $\lambda/4$, $\lambda/2$, $\lambda/2$, $\lambda/2$, $\lambda/8$, $\lambda/2$, $\lambda/2$, $\lambda/2$, $\lambda/4$, $\lambda/2$, $\lambda/2$ and $\lambda/2$ in the direction of rotation of the magnetic drum 1. In the magnetic detector of FIG. 4, similarly as in the above-described embodiments, the noise component is zeroed. Because the unitary segments are each made up of four MR strips, the resistance thereof and accordingly the power consumption is decreased.

Figure 5:
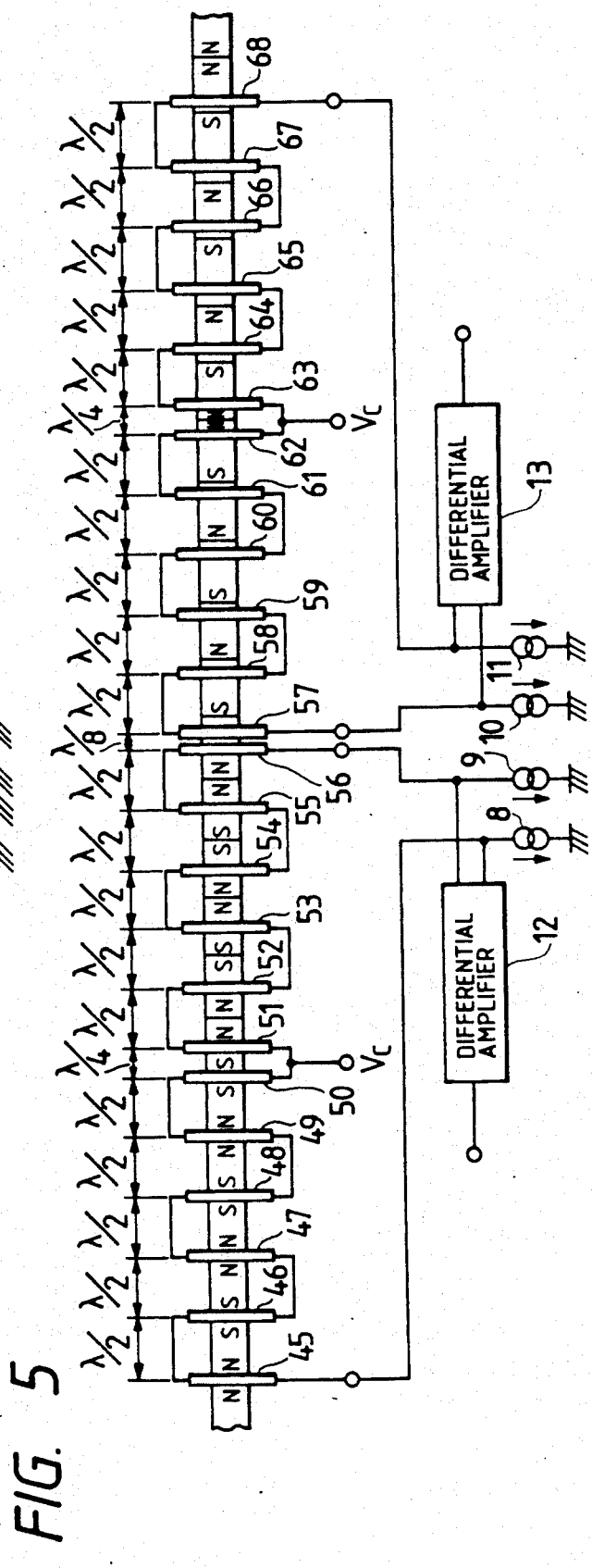

FIG. 5 shows a fifth example of the magnetic detector according to the invention.

In the magnetic detector, the unitary segments are made up of groups of six MR strips 45 through 50, six MR strips 51 through 56, six MR strips 57 through 62, and six MR strips 63 through 68, respectively, and they are connected between the DC source and the constant current sources 8 through 11, as shown in FIG. 5. The MR strips 45 through 68 are confronted with the magnetic drum 1, and arranged at intervals of $\lambda/2$, $\lambda/2$, $\lambda/2$, $\lambda/2$, $\lambda/2$, $\lambda/4$, $\lambda/2$, $\lambda/2$, $\lambda/2$, $\lambda/2$, $\lambda/2$, $\lambda/8$, $\lambda/2$, $\lambda/2$, $\lambda/2$, $\lambda/2$, $\lambda/2$, $\lambda/4$, $\lambda/2$, $\lambda/2$, $\lambda/2$ and $\lambda/2$ in the direction of rotation of the magnetic drum 1. Similarly as in the above-described embodiments, the noise component is zeroed.

Figure 9:
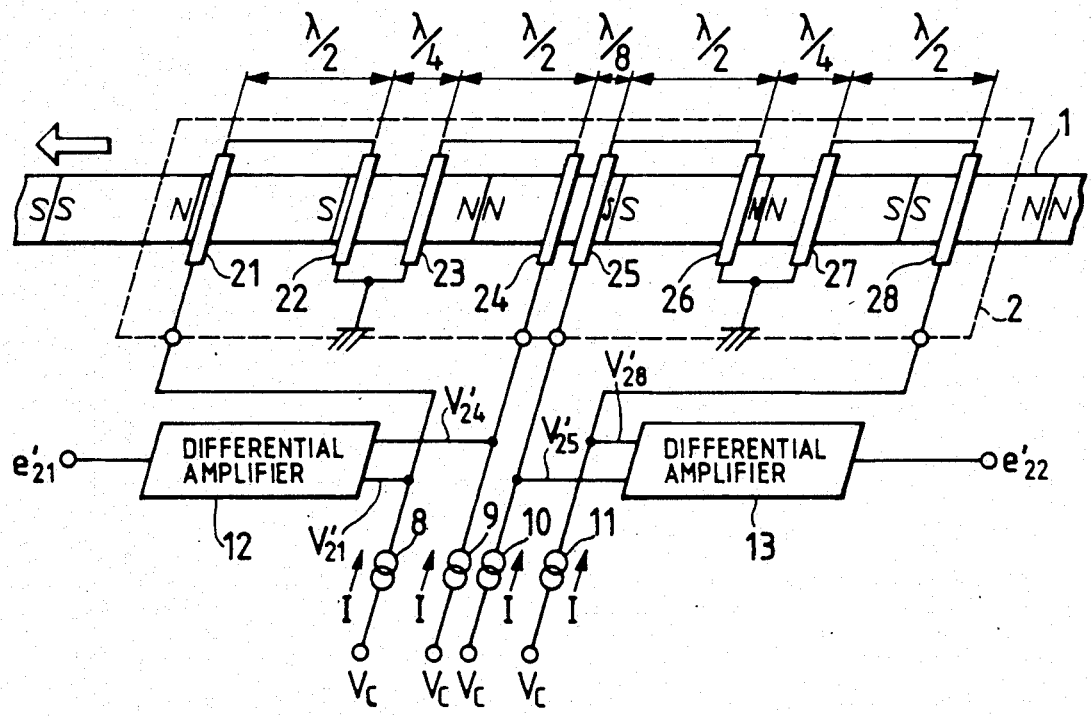

FIG. 9 shows a sixth example of the magnetic detector according to the invention. The magnetic detector of FIG. 9 is obtained by modifying the magnetic detector shown in FIG. 1 as follows: That is, the connection of the terminals of the DC source is so changed that the direction of flow of the current I is opposite to the direction in which the current flows in the magnetic detector of FIG. 1.

In the magnetic detector of FIG. 9, the output $e'_{21}(x)$ of the differential amplifier is as follows:

$$e'_{21}(x) = 2R_0IABa^2 \cos(4\pi x/\lambda) \qquad (25')$$

On the other hand, the output $e_{21}(x)$ of the diffential amplifier is as expressed by equation (25). That is, equations (25') and (25) are different only in sign. Since the direction of flow of the current in FIG. 9 is opposite to the direction of flow of the current in FIG. 1, the output of the differential amplifier in FIG. 9 is opposite in phase to that of the differential amplifier in FIG. 1.

When I is regareded as $-I$, then $$e'_{21}(x) = -2R_0(-I)ABa^2 \cos 4\pi x/\lambda$$

can be held.

In the embodiments, the same effects can be obtained by using comparators instead of the differential amplifiers.

Figure 7:
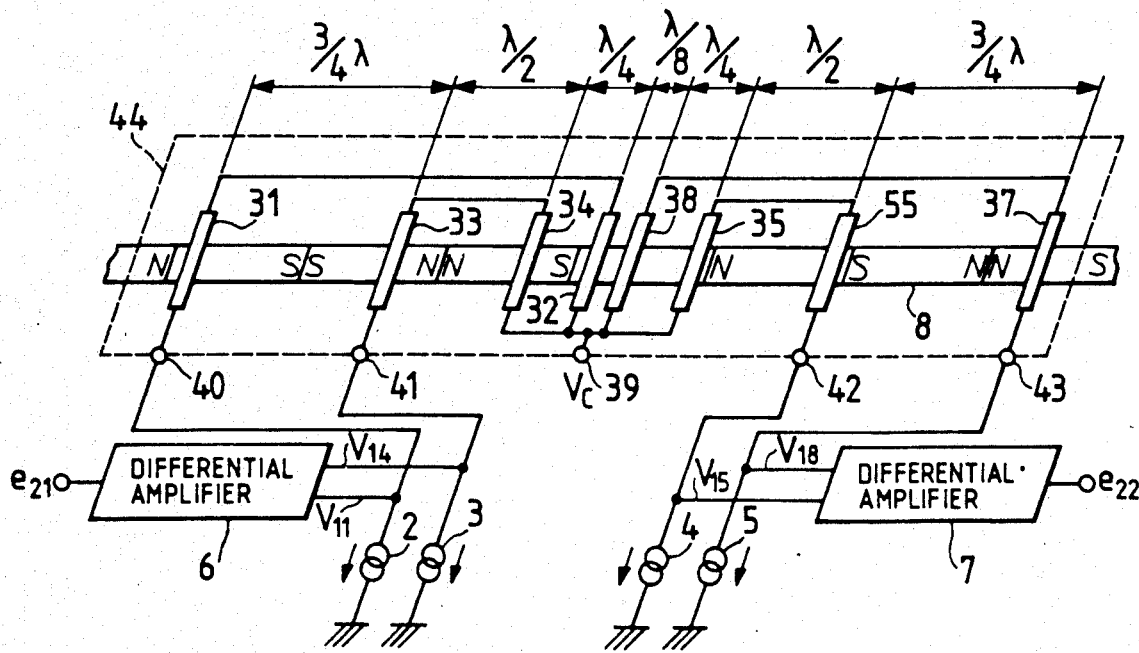

FIG. 7 shows a seventh example of the magnetic detector according to the invention. The seventh example can be obtained by modifying the magnetic detector shown in FIG. 1 in such a manner that the MR strips are rearranged, and are connected to one power source terminal.

That is, in the magnetic detector shown in FIG. 7, a magnetic resistance element 44 comprising MR strips 31 through 38 is employed. Pairs of MR strips 31 and 32, 33 and 34, 35 and 36, and 37 and 38 are series-connected as unitary segments, respectively. First ends of the unitary segments are connected to one power source terminal 39, and the remaining ends are connected to signal lead-out terminals 40, 41, 42 and 43, respectively. The power source terminal 39 of the MR element 44 is connected to a DC source having an output voltage Vc. The signal lead-out terminals 40 through 43 of the MR element 44 are connected to constant current sources 2, 3, 4 and 5, respectively. The MR strips 31 through 38 face a magnetic drum 8, and are arranged in the order of the MR strips 31, 33, 34, 32, 38, 36, 35 and 37 at intervals of 3 $\lambda/4$, $\lambda/2$, $\lambda/4$, $\lambda/8$, $\lambda/4$, $\lambda/2$ and 3 $\lambda/4$ in the direction of the magnetic drum 8.

If it is assumed the the resistances of the MR stirps 31 through 38 are represented by $R_{31}(x)$ through $R_{38}(x)$, respectively, then the following equations are held:

$$R_{31}(x) = R_{21}(x)$$

$$\begin{aligned}
R_{32}(x) &= R_{31}(x + 3\lambda/2) \\
&= R_{31}(x + \lambda/2) \\
&= R_{31}(x + \lambda/2) = R_{22}(x)
\end{aligned}$$

$$\begin{aligned}
R_{33}(x) &= R_{21}(x + 3\lambda/4) \\
&= R_{21}(x + 3\lambda/4) = R_{23}(x)
\end{aligned}$$

$$\begin{aligned}
R_{34}(x) &= R_{31}(x + 5\lambda/4) \\
&= R_{31}(x + \lambda/4) \\
&= R_{21}(x + \lambda/4) = R_{24}(x)
\end{aligned}$$

$$\begin{aligned}
R_{35}(x) &= R_{31}(x + 19\lambda/8) \\
&= R_{31}(x + 3\lambda/8) \\
&= R_{21}(x + 3\lambda/8) = R_{25}(x)
\end{aligned}$$

$$\begin{aligned}
R_{36}(x) &= R_{31}(x + 15\lambda/8) \\
&= R_{31}(x + 7\lambda/8) \\
&= R_{21}(x + 3\lambda/8) = R_{26}(x)
\end{aligned}$$

$$\begin{aligned}
R_{37}(x) &= R_{31}(x + 25\lambda/8) \\
&= R_{31}(x + \lambda/8) \\
&= R_{21}(x + 3\lambda/8) = R_{27}(x)
\end{aligned}$$

$$\begin{aligned}
R_{38}(x) &= R_{31}(x + 13\lambda/8) \\
&= R_{31}(x + 5\lambda/8) \\
&= R_{21}(x + 5\lambda/8) = R_{28}(x)
\end{aligned}$$

As is apparent from the above description, the MR strips 31 through 38 of the MR element 44 are equivalent in arrangement to the MR strips 9 through 26 of the MR element 1 in the above-described magnetic detector element. Therefore, the MR element 4 has the same function as the MR element 1, and the magnetic detector of FIG. 7 operates in the same manner as the above-described magnetic detector element.

In the magnetic detector of FIG. 7, the number of terminals (the signal lead-out terminals 40 through 43, and the power source terminal 39) is five (5); that is, it is smaller by one than in the above-described embodiments, and therefore the area of the chip of the MR element 44 can be reduced, which will contribute to the reduction of the manufacturing cost of the magnetic detector.

Figure 8:
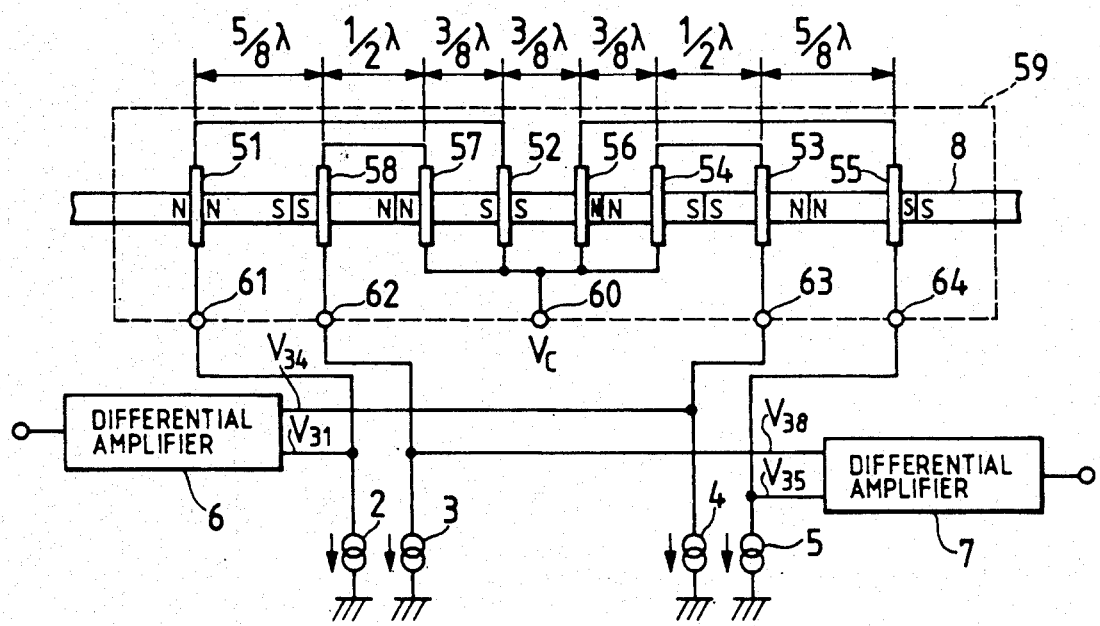

FIG. 8 shows one modification of the magnetic detector of FIG. 7. In the magnetic detector of FIG. 8, an MR element 59 comprises pairs of MR strips 51 through 58 which are series-connected as unitary segments, respectively. First ends of the unitary segments are connected to a power source terminal 60, and the remaining ends are connected to signal lead-out terminals 61 through 64, respectively. The power source terminal 60 of the MR element 59 is connected to a DC source having an output voltage Vc, and the signal lead-out terminals 61 through 64 are connected to constant current sources 2 through 5, respectively. The MR strips 51 through 58 face a magnetic drum 8, and are arranged in the order of the MR strips 51, 58, 57, 52, 56, 54, 53 and 55 at intervals of 5 λ/8, λ/2, 3 λ/8, 3 λ/8, 3 λ/8, λ/2 and 5 λ/8 in the direction of rotation of the magnetic drum 8.

When it is assumed that the MR strips 51 through 58 have resistances $R_{51}(x)$ through $R_{58}(x)$, respectively, then the following equations are held:

$$R_{51}(x) = R_{31}(x)$$
$$R_{52}(x) = R_{51}(x + 3\lambda/2)$$

$$\begin{aligned}R_{53}(x) &= R_{51}(x + 11\lambda/4) \\ &= R_{51}(x + 3\lambda/4) = R_{33}(x)\end{aligned}$$

$$\begin{aligned}R_{54}(x) &= R_{51}(x + 9\lambda/4) \\ &= R_{51}(x + \lambda/4) = R_{34}(x)\end{aligned}$$

$$\begin{aligned}R_{55}(x) &= R_{51}(x + 27\lambda/8) \\ &= R_{51}(x + 3\lambda/8) = R_{35}(x)\end{aligned}$$

$$\begin{aligned}R_{56}(x) &= R_{51}(x + 15\lambda/8) \\ &= R_{51}(x + 7\lambda/8) = R_{36}(x)\end{aligned}$$

$$\begin{aligned}R_{57}(x) &= R_{51}(x + 9\lambda/8) \\ &= R_{51}(x + \lambda/8) = R_{37}(x)\end{aligned}$$

$$\begin{aligned}R_{58}(x) &= R_{51}(x + 13\lambda/8) \\ &= R_{51}(x + 5\lambda/8) = R_{38}(x)\end{aligned}$$

As is apparent from the above-description, the MR element 59 has the same function as the MR element 1 of the above-described magnetic detector element, and the magnetic detector of FIG. 8 operates in the same manner as the magnetic detector element.

In the magnetic detector of FIG. 8 also, the number of terminals (the signal lead-out terminals 61 through 64 and the power source terminal 60) of the MR element 59 is reduced to five, and therefore the area of the chip of the MR element 59 can be reduced as much, which will contribute to the reduction of the manufacturing cost of the magnetic detector.

In the above-described magnetic detector, differential amplifiers 6 and 7 subject the voltages $V_{11}(x)$ ($V_{31}(x)$) and $V_{14}(x)$ ($V_{34}(x)$) of the constant current sources 2 and 3 and the voltages $V_{15}(x)$ ($V_{35}(x)$) and $V_{18}(x)$ ($V_{38}(x)$) of the constant current sources 4 and 5 to differential amplification to obtain approximate sine waves; however, instead of the differential amplifiers 6 and 7, voltage comparators may be employed.

Either the current drive system or the voltage drive system may be employed for driving the MR strips. In the above-described examples of the magnetic detector of the invention, the current drive system is employed. The difference between the case where, in the invention, the current drive system is employed for driving the MR strips, and the case where, in the invention, the voltage drive system is employed for the same purpose will be described.

Figure 6:
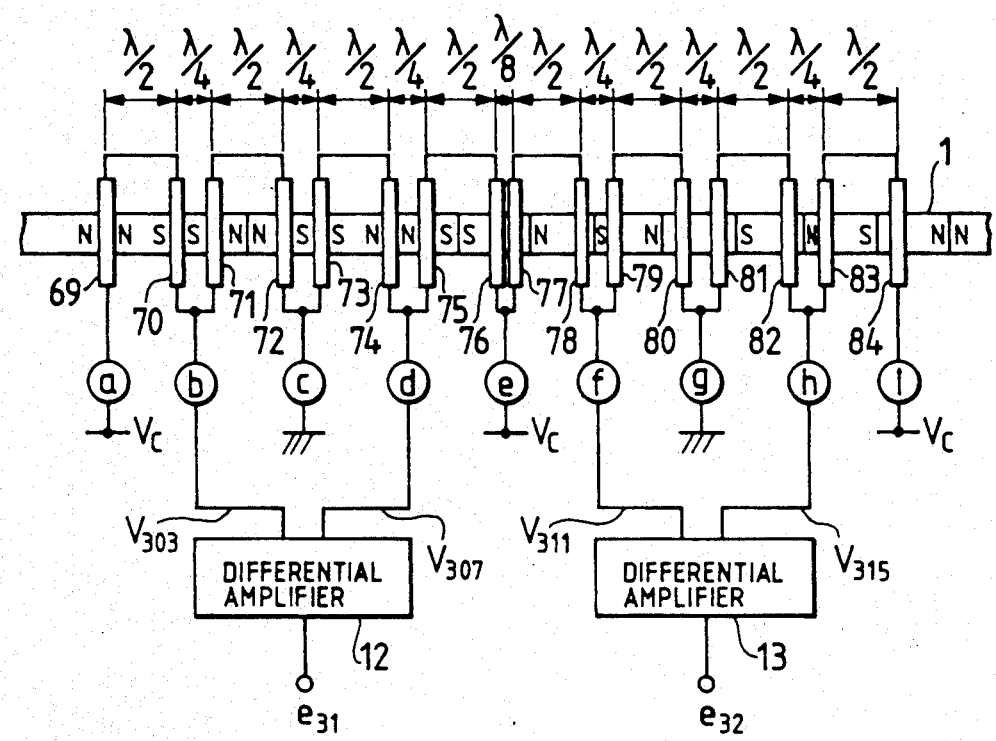
Figure 10A:
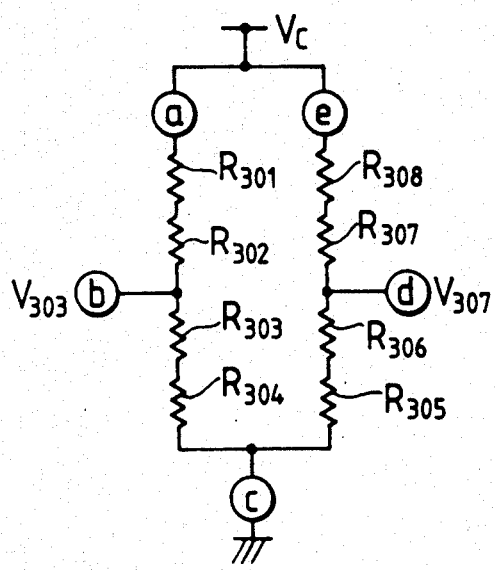
FIGS. 10a and 10b are equivalent circuits of the MR element in the magnetic detector.
Figure 10B:
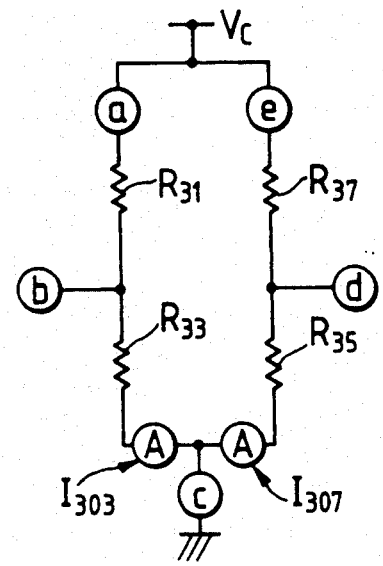
Figure 11:
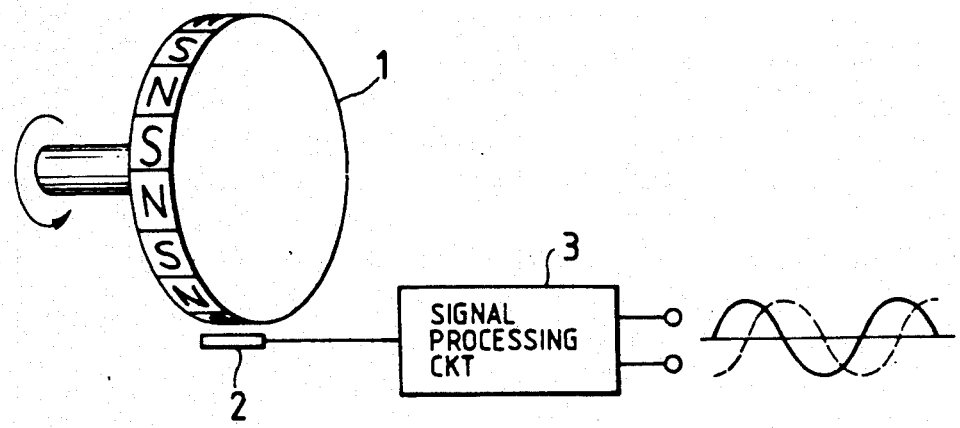
FIG. 11 is an explanatory diagram outlining the arrangement of one example of a conventional magnetic detector.
Figure 12:
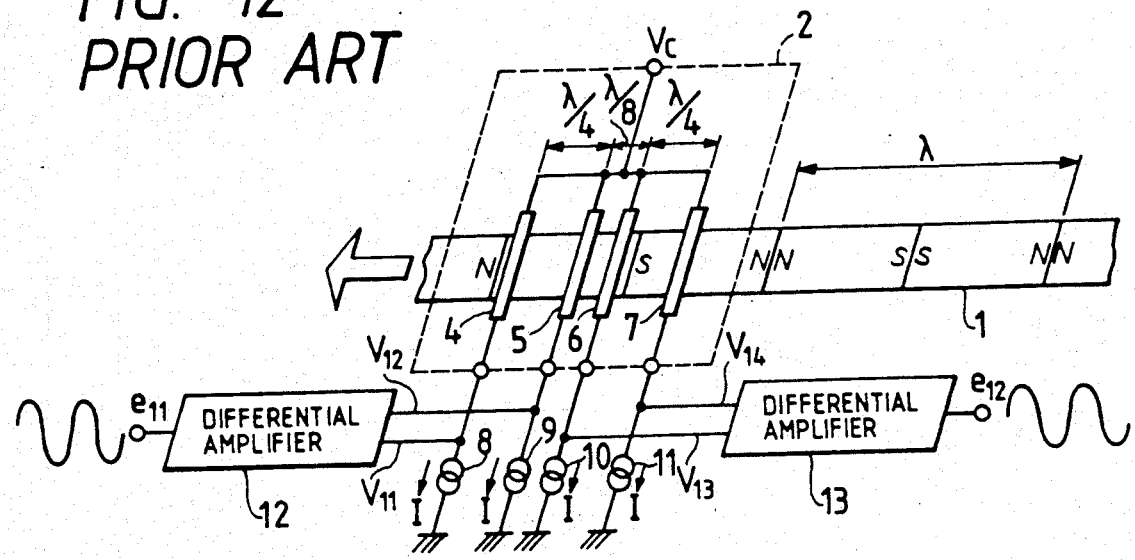
FIG. 12 is a diagram showing the conventional magnetic detector shown in FIG. 11.
Figure 13A:
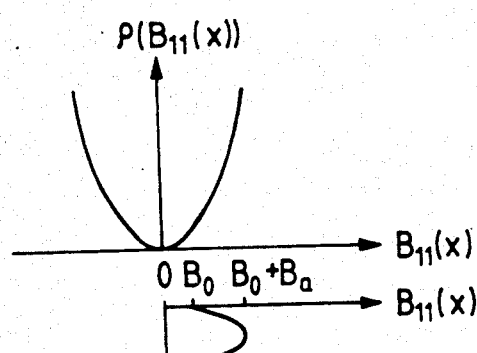
FIGS. 13a-13c are characteristic diagrams for a description of the operation of the conventional magnetic detector.
Figure 13B:
Figure 13C:
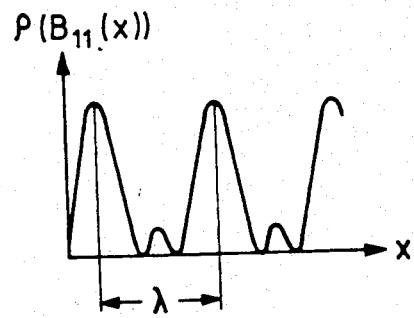

In the latter case, a magnetic detector as shown in FIG. 6 can be considered. MR strips 69 through 72, 73 through 76, 77 through 80, and 81 through 84 are series-connected as unitary segments. First ends of the unitary segments are connecting to a DC source having an output voltage Vc, and the other ends are grounded. A voltage at the connecting point of the MR strips 70 and 71 and a voltage at the connecting point of the MR strips 74 and 75 are applied to differential amplifier 12. Similarly, a voltage at the connecting point of the MR strips 78 and 79 and a voltage at the connecting point of the MR strips 82 and 83 are applied to a differential amplifier 13. The MR strips 69 through 84 face a magnetic drum 1, and are arranged at intervals of λ/2, λ/4, λ/2, λ/4, λ/2, λ/4, λ/2, λ/8, λ/2, λ/4, λ/2, λ/4, λ/2, λ/4 and λ/2 in the direction of rotation of the magnetic drum 1. FIG. 10 shows an equivalent circuit of a part of the magnetic detector of voltage drive system.

If it is assumed that, in the magnetic detector of voltage drive system, the MR strips 69 through 84 have resistance $R_{301}(x)$ through $R_{316}(x)$, respectively, the voltages at the above-described connecting points of the MR strips 70 and 71, 74 and 75, 78 d 79, and 82 and 83 are represented by $V_{303}(x)$, $V_{307}(x)$, $V_{311}(x)$ and $V_{313}(x)$, respectively, and the differential amplifiers 12 and 13 have an amplification factor of "1", and provide output voltages $e_{31}(x)$ and $e_{32}(x)$, respectively, then the following equations are held:

$$R_{301}(x) = R_{11}(x) \tag{A1}$$
$$R_{302}(x) = R_{301}(x + \lambda/2) \tag{A2}$$
$$R_{303}(x) = R_{301}(x + 3\lambda/4) \tag{A3}$$

$$\begin{aligned}R_{304}(x) &= R_{301}(x + 5\lambda/4) \\ &= R_{301}(x + \lambda/4)\end{aligned} \tag{A4}$$

$$\begin{aligned}R_{305}(x) &= R_{301}(x + 3\lambda/2) \\ &= R_{301}(x + \lambda/2)\end{aligned} \tag{A5}$$

$$\begin{aligned}R_{306}(x) &= R_{301}(x + 2\lambda) \\ &= R_{301}(x)\end{aligned} \tag{A6}$$

$$\begin{aligned}R_{307}(x) &= R_{301}(x + 9\lambda/4) \\ &= R_{301}(x + \lambda/4)\end{aligned} \tag{A7}$$

$$\begin{aligned}R_{308}(x) &= R_{301}(x + 11\lambda/4) \\ &= R_{301}(x + 3\lambda/4)\end{aligned} \tag{A8}$$

$$R_{31}(x) \stackrel{\Delta}{=} R_{301}(x) + R_{302}(x) \tag{A9}$$

$$R_{33}(x) \stackrel{\Delta}{=} R_{303}(x) + R_{304}(x) \tag{A10}$$

$$R_{35}(x) \stackrel{\Delta}{=} R_{305}(x) + R_{306}(x) \tag{A11}$$

$$R_{37}(x) \stackrel{\Delta}{=} R_{307}(x) + R_{308}(x) \tag{A12}$$

$$V_{303}(x) = \{R_{33}(x)/(R_{31}(x) + R_{33}(x))\}Vc \tag{A13}$$
$$V_{307}(x) = \{R_{35}(x)/(R_{35}(x) + R_{37}(x))\}Vc \tag{A14}$$

$$e_{31}(x) \stackrel{\Delta}{=} V_{303}(x) - V_{307}(x) \tag{A15}$$

With reference to equation (8), equation (A1) can be rewritten as follows:

$$R_{301}(x) = Ro\{1 - A(Bo^2 + Ba^2/2 + 2\,BoBa \\ \sin(2\pi/\lambda)x - (Ba^2/2) \times \\ \cos(4\pi/\lambda)x)\} \tag{A16}$$

Equations (A2) through (A8) can be rewritten as follows:

$$R_{302}(x) = Ro\{1 - A(Bo^2 + Ba^2/2 - 2 * \\ B_o Ba \sin(2\pi/\lambda)x - (Ba^2/2) * \\ \cos(4\pi/\lambda x)\} \tag{A17}$$

$$R_{303}(x) = Ro\{1 - A(Bo^2 + Ba^2/2 - 2 * \\ BoBa \sin(2\pi/\lambda)x + (Ba^2/2) * \\ \cos(4\pi/\lambda)x)\} \tag{A18}$$

$$R_{304}(x) = Ro\{1 - A(Bo^2 + Ba^2/2 + 2 * \\ Bo\,Ba \sin(2\pi/\lambda)x + (Ba^2/2) * \\ \cos(4\pi/\lambda)x)\} \tag{A19}$$

$$R_{305}(x) = Ro\{1 - A(Bo^2 + Ba^2/2 - 2 * \\ BoBa \sin(2\pi/\lambda)x - (Ba^2/2) * \\ \cos(4\pi/\lambda)x)\} = R_{302}(x) \tag{A20}$$

$$R_{306}(x) = Ro\{1 - A(Bo^2 + Ba^2/2 + 2) * \\ BoBa \sin(2\pi/\lambda)x - (Ba^2/2) * \\ \cos(4\pi/\lambda)x)\} \\ = R_{301}(x) \tag{A21}$$

$$R_{307}(x) = Ro\{1 - A(Bo^2 + Ba^2/2 + 2 * \\ BoBa \sin(2\pi/\lambda)x + (Ba^2/2) * \\ \cos(4\pi/\lambda)x)\} \\ = R_{304}(x) \tag{A22}$$

$$R_{308}(x) = Ro\{1 - A(Bo^2 + Ba^2/2 - 2 * \\ BoBa \sin(2\pi/\lambda)x + (Ba^2/2) * \\ \cos(4\pi/\lambda)x)\} \\ = R_{303}(x) \tag{A23}$$

With reference to equations (A9) through (A12), $R_{31}(x)$, $R_{33}(x)$, $R_{35}(x)$ and $R_{37}(x)$ are as follows:

$$R_{31}(x) = 2Ro\{1 - A(Bo^2 + Ba^2/2 - \\ (Ba^2/2)\cos(4\pi/\lambda)x)\} \tag{A24}$$

$$R_{33}(x) = 2Ro\{1 - A(Bo^2 + Bo^2/2 + \\ (Ba^2/2)\cos(4\pi/\lambda)x)\} \tag{A25}$$

$$R_{35}(x) = 2Ro\{1 - A(Bo^2 + Ba^2/2 - \\ (Ba^2/2)\cos(4\pi/\lambda)x)\} \tag{A26}$$

$$R_{37}(x) = 2Ro\{1 - A(Bo^2 + Ba^2/2 + \\ (Ba^2/2)\cos(4\pi/\lambda)x)\} \tag{A27}$$

According to equations (A13) and (A14), $V_{303}(x)$ and $V_{207}(x)$ are as follows:

$$V_{303}(x) = [2Ro\{1 - A(Bo^2 + Ba^2/2 + \\ (Ba^2/2)\cos(4\pi/\lambda)x)\}/4Ro * \\ \{1 - A(Bo^2 + Ba^2/2)\}] \times Vc \\ = Vc/2 - [\{(1/2) A\,Ba^2 \cos(4\pi/\lambda)x\}/2\{1 - \\ A(Bo^2 + Ba^2)\}] * Vc \tag{A28}$$

$$V_{307}(x) = [2Ro\{1 - A(Bo^2 + Ba^2/2 - \\ (Ba^2/2)\cos(4\pi/\lambda)x)\}/4Ro * \\ \{1 - A(Bo^2 + Ba^2/2)\}] * Vc \\ = Vc/2 + [\{(1/2) A\,Ba^2 \cos(4\pi/\lambda)x\}/2 * \\ \{1 - A(Bo^2 + Ba^2)\}] * Vc \tag{A29}$$

From equation (A15), the output signal $e_{31}(x)$ of the differential amplifier 12 is as follows:

$$e_{31}(x) = - \frac{A\,Ba^2 \cos(4\pi/\lambda)x}{2\{1 - A(Bo^2 + Ba^2/2)\}} * Vc \tag{A30}$$

In the embodiment, by adding $R_{301}(x)$ of equation (A16) to $R_{302}(x)$ of equation (A17) to obtain $R_{31}(x)$ as indicated by equation (A24), the noise component $\sin(2\pi/\lambda)x$ is cancelled. That is, in the voltage drive system also, the noise component can be cancelled out by arranging the series-connected MR strips at intervals of $\lambda/2$.

It is assumed that, in the voltage drive system, the currents following in the resistors $R_{33}(x)$ and $R_{35}(x)$ of FIG. 10 are represented by $I_{303}$ and $I_{307}$, respectively. Then, from equations (A24) through (A27), $$I_{303} = Vc/(R_{31}(x) + R_{33}(x)) \\ = Vc/4Ro\{1 - A(Bo^2 + Ba^2/2)\} \tag{A31}$$

$$I_{307} = Vc/(R_{35}(x) + R_{37}(x)) \\ = Vc/4Ro\{1 - A(Bo^2 + Ba^2/2)\} \tag{A32}$$

Thus, the two currents are equal to each other. Therefore, in the voltage drive system, the power consumption per phase is as follows:

$$Pv = Vc = 2I_{303} \\ = Vc^2/2Ro\{1 - A(Bo^2 + Ba^2/2)\} \tag{A33}$$

And it is apparent that the output voltage has the following amplitude:
From equation (A30), $$Av \triangleq A Ba^2 Vc/2\{1 - A(Bo^2 + Ba^2/2)\} \tag{A34}$$

On the other hand, in the magentic detector shown in FIG. 1, the current consumption for the supply voltage $Vc$ is $2\,I$, and therefore the power consumption $Pc$ is as follows:

$$Pc \triangleq 2VcI \tag{A35}$$

The amplitude $Ac$ of the output voltage is as follows:
From equation (25), $$Ac \triangle 2RoIABa^2 \quad (A36)$$

The power consumption Pc includes those of the constant current sources, and it will be referred to as "a detecting section power consumption" so as to be distinguished from an MR element power consumption (described later).

Now, the drive current Ie with which the voltage drive system and the current drive system provide the same output amplitude will be described.

$$Av = Ac,$$

and therefore $$Ie = Vc/4Ro\{1 - A(Bo^2 + Ba^2/2)\} \quad (A37)$$

Let Ie be the current of the constant current sources 8 through 11 in the magnetic detector shown in FIG. 1, then the power consumption per phase is as follows:
From equation (A35), $$Pc = 2Vc \cdot Vc/4Ro\{1 - A(Bo^2 + Ba^2/2)\} \quad (A38)$$
$$= Vc^2/2Ro\{1 - A(Bo^2 + Ba^2/2)\}$$

This is equal to the above-described power consumption in the voltage drive system. Therefore, when the MR elements in the embodiment of FIG. 1 and in the magnetic detector of voltage drive system shown in FIG. 6 are so driven that the output voltage amplitudes thereof are equal to each other, then the power consumption thereof will be equal. However, it should be noted that, in the magnetic detector of the voltage drive system, four MR strips are series-connected between the DC source and ground, whereas in the embodiment of FIG. 1, two MR strips are series-connected between the DC source and ground; that is, the embodiment of FIG. 1 is smaller in the number of MR strips, and accordingly smaller in power consumption.

Let us consider the MR element power consumption of the magnetic detector of voltage drive system and the embodiment of FIG. 1.

In the magnetic detector of the voltage drive system, the detecting section power consumption itself is the MR element power consumption Pv' per phase:

$$Pv' = Pv = Vc^2/2Ro\{1 - A(Bo^2 + Ba^2/2)\} \quad (A39)$$

On the other hand, in the embodiment of FIG. 1, the MR element power consumption Pc' is as follows:

$$Pc' = (R_{21}(x) + R_{22}(x))I^2 + (R_{23}(x) + R_{24}(x))I^2 \quad (A40)$$

From equations (A19) through (A22) and (A37), $$Pc' = Vc^2/4Ro\{1 - A(Bo^2 + Ba^2/2)\} \quad (A41)$$

From comparison of equations (A39) to (A41), $$Pc' + Pv'/2 \quad (A42)$$

That is, the MR element power consumption Pc' in the current drive system magnetic detector is a half of that Pv' in the voltage drive system magnetic detector. Accordingly, the MR element in the current drive system magnetic detector is lower in temperature than that in the voltage drive system magnetic detector. Since the sensitivity (A in equation (6)) of the MR strips has a negative temperature coefficient, as the temperature of the MR strips decreases, the value A of equation (6) is increased, and the output voltage amplitude ($2R_OIA$-$Ba^2$ is equation (25)) is increased. That is, in the current drive system in which the MR element power consumption is small, it is rather difficult for the heat generated by the MR element to decrease the output voltage amplitude.

Now, let us consider, in a comparison mode, the temperature coefficient of the output voltage amplitude in the current drive system magnetic detector shown in FIG. 1 and that of the ouput voltage amplitude in the voltage drive system magnetic detector.

In the magnetic detector of FIG. 1, the output amplitude of the differential amplifier 12 is $2R_{OIA}Ba^2$ (from equation (25)). On the other hand, in the voltage drive system magnetic detector, the output amplitude of the differential amplifier 12 is $ABa^2Vc/(1 - A(Bo^2 + Ba^2/2))$ (from equation A30). In the denominator A ($Bo^2 + Ba^2/2$) is about 0.02. Therefore, with $1 >> 0.02$, the output amplitude can be approximated to $ABa^2Vc/2$. It has been found through experiments that, in the embodiment of FIG. 1, the temperature coefficient of the output amplitude of the differential amplifier 12 is $-1800$ ppm/° C., and in the voltage drive system magnetic detector, it is $-4200$ ppm/° C.

When the current I in the current drive system magnetic detector and the voltage Vc in the voltage drive system magnetic detector are made constant irrespective of temperature, then both detectors have $ABa^2$ as a common temperature coefficient factor, and the only current drive system magnetic detector has $R_O$ as a temperature coefficient factor. The factor $ABa^2$ is the resistance change rate of the MR strips when the signal magnetic flux density is Ba in amplitude, and its temperature coefficient is $-4200$ ppm/° C. The factor $R_O$ is the resistance of the MR strips provided when they are free from magnetic flux density, and its temperature coefficient is approximately $+3700$ ppm/° C. Accordingly, the temperature coefficient of the output voltage amplitude in the voltage drive system magnetic detector is the temperature coefficient of the factor $ABa^2$, thus being $-4200$ ppm/° C. On the other hand, the temperature coefficient of the output voltage amplitude in the current drive system magnetic detector is $-1800$ ppm/° C. (determined through experiment) because the temperature coefficient of the factor $ABa^2$ and the temperature coefficient of the factor $R_O$ are cancelled out by each other. As is apparent from the above-description, in the current drive system magnetic detector, the temperature coefficient of the output voltage amplitude can be reduced to about a half ($\frac{1}{2}$) of that of the output voltage amplitude in the voltage drive system magnetic detector.

The results of comparison of the current drive system magnetic detector shown in FIG. 1 with the voltage drive system magnetic detector may be summarized as follows:

| Comparison items | Current drive system | Voltage drive system |
|---|---|---|
| Number of MR strips | 8 | 16 |
| Spread of MR strips | $4 \times \lambda/2 + 2 \times \lambda/4 + \lambda/8 = 2.625$ | $8 \times \lambda/2 + 6 \times \lambda/4 + \lambda/8 = 5.625$ |
| Number of terminals | 6 | 9 |
| Temperature coefficient of | small | large |

-continued

| Comparison items | Current drive system | Voltage drive system |
|---|---|---|
| output voltage Detecting section power consumption ratio with same output voltage | 1 | 1 |
| MR element power consumption ratio with output voltage | 1/2 | 1 |
| Externally connected parts | many | none |

Since the MR element 2 is arranged in such a manner as to face the magnetic drum 1, if the spread in arrangement of the MR strips is large, then the magnetic field applied to the MR strips by the magnetic drum 1 is low in strength, and accordingly the output signals thereof are small. Hence, the spread in arrangement of the MR strips should be small. In addition, as the number of terminals employed is decreased, the area of the chip of the MR element 2 is decreased, and accordingly the manufacturing cost thereof is decreased as much. Thus, the number of terminals should be minimized. Furthermore, the fact that the output signal of the MR element 2 is free from temperature is advantageous, because the degree of freedom in designing the signal processing circuit 3 is increased as much. The fact that the MR element power consumption is small means that the working temperature of the MR strips is low. Having a negative temperature coefficient, advantageously the sensitivity of the MR element is increased with the reduction of the power consumption.

Thus, the current drive system magnetic detector is disadvantageous in that the number of externally attached components is relatively large; however, its merits more than offset the demerit.

As was described above, in the magnetic detector which comprises a magnetic recording medium magnetized with a repetitive signal having a predetermined wavelength $\lambda$; and a magnetic resistance element having magnetic strips arranged facing the magnetic recording medium, the magnetic resistance element is made up of 2m magnetic strips (where m is a natural number) which are arranged at intervals of $(n-\frac{1}{2})\lambda$ (where n is a natural number) and series-connected as unitary segments, and the magnetic resistance element is driven with constant current sources. Therefore, with the magnetic detector of the invention, the $\frac{1}{2}$ period noise component is cancelled, and the resistance being increased, the current consumption is decreased.

While the invention has been described in connection with its preferred embodiments, it will be obvious to those skilled in the art that various changes and modification may be made therein without departing from the invention, and it is aimed, therefore, to cover in the appended claims all such changes and modifications fall within the scops of the invention

What is claimed is:

1. A magnetic detector comprising:
    a magnetic recording medium magnetized with a repetitive signal having a predetermined wavelength $\lambda$:
    a magnetic resistance element comprising 2m magnetic resistance strips which are arranged at intervals of $(n-\frac{1}{2})\lambda$ (where m and n are natural numbers), wherein said strips are connected in series with one another, said magnetic resistance element being held to face said magnetic recording medium;
    a DC source connected to interconnected ends of at least a preselected pair of two adjacent ones of said strips;
    first and second constant current sources connected to ends of other ones of said strips;
    means for producing an output signal as a difference between voltages at said ends of other ones of said strips.

2. A magnetic detector as clamimed in claim 1, in which said interconnected ends of said preselected pair of said strips are connected to the positive terminal of said DC source, the negative terminal of said DC source being connected to a ground terminal, and said ends of other ones of said strips being connected through said constant current sources to said ground terminal.

3. A magnetic detector as claimed in claim 1, in which one end of a series of connected pair of magnetic resistance strips is grounded, and the other end thereof is connected through a constant current source to the positive terminal of said DC source.

4. A magnetic detector as claimed in claim 1, in which said magnetic resistance strips are arranged in parallel with one another.

5. A magnetic detector as claimed in claim 1, in which said magnetic recording medium is a magnetic drum which is magnetized with said repetitive signal.

6. A magnetic detector as claimed in claim 1, in which said strips are interconnected such that every two of said series-connected strips provide outputs opposite in phase to each other, and wherein said means for providing an output signal comprises a differential amplifier.

7. A magnetic detector as claimed in claim 6, in which said every two unitary segments providing output opposite in phase to each other are spaced by $\frac{1}{4}$ M$\lambda$ (where M is a positive odd number) from each other.

8. A magnetic detector as claimed in claim 1, in which said magnetic resistance element comprises: a first magnetic resistance element unit for providing a first phase output; and a second magentic resistance element unit for providing a second phase output.

9. A magnetic detector as claimed in claim 8, in which the distance between said first and second magnetic resistance element units is $\frac{1}{4}$ L$\lambda$ (where L is a positive odd number).

10. A magnetic detector comprising:
    four unitary segment each including two magnetic resistance strips which are spaced by $(n-\frac{1}{2})\lambda$ from each other and series-connected (where n is a natural number),
    first ends of said four unitary segments being connected to the positive terminal of a power source,
    the remaining ends of said four unitary segments being connected to respective constant current sources, and
    further comprising means for producing an output signal as a difference between voltages at said remaining ends of said four unitary segments.

11. A magnetic detector comprising:
    four unitary segments each including two magnetic resistance strips which are spaced by $(n-\frac{1}{2})\lambda$ and series-connected,
    first ends of said four unitary segments being grounded,
    the remaining ends of said four unitary segments being connected to respective DC sources through respective constant current sources, and
    further comprising mean for producing an output signal as a difference between voltages at said remaining ends of said four unitary segment.

* * * * *